United States Patent
Schmidt et al.

[11] 3,946,370
[45] Mar. 23, 1976

[54] METHOD OF MAKING LIGHT-DOT DISTRIBUTION FOR THE HOLOGRAPHIC STORAGE OF BINARY INFORMATION WITH THE AID OF ELECTRONICALLY CONTROLLED SWITCHING MASKS

[75] Inventors: Klaus Peter Schmidt, Quickborn; Bernhard Hill, Hamburg, both of Germany

[73] Assignee: U.S. Philips Corporation, New York, N.Y.

[22] Filed: May 19, 1975

[21] Appl. No.: 578,613

Related U.S. Application Data

[63] Continuation of Ser. No. 411,651, Nov. 1, 1973, abandoned.

[30] Foreign Application Priority Data
Nov. 2, 1972 Germany............................ 2253626

[52] U.S. Cl............................. 340/173 LM; 350/3.5
[51] Int. Cl.² G11C 11/22; G11C 7/00; G11C 13/04
[58] Field of Search............... 340/173 LT, 173 LM; 346/76 L; 350/3.5, 162 SF; 179/100.3 G

[56] References Cited
UNITED STATES PATENTS

| | | | |
|---|---|---|---|
| 3,453,640 | 7/1969 | Blackmer...................... | 179/100.3 G |
| 3,631,411 | 12/1971 | Kosonocky.................... | 340/173 LS |
| 3,812,496 | 5/1974 | Brooks.......................... | 340/173 LM |
| 3,833,893 | 9/1974 | Rajchman..................... | 340/173 LM |

OTHER PUBLICATIONS

Blackmer et al., Application of Phase Modulation to Digital Data Recording by Means of Superposed Diffraction Gratings, Applied Optics, Vol. 10, No. 5, 5/1971, pp. 1148–1152.

*Primary Examiner*—Stuart N. Hecker
*Attorney, Agent, or Firm*—Frank R. Trifari; Simon L. Cohen

[57] ABSTRACT

The invention relates to a method of making light dot distributions for the holographic storage of binary information with the aid of electronically controlled switching masks, characterized in that the individual elements of the switching mask are modulated in their path length through fading of the interference structure in the hologram associated with said elements.

3 Claims, 6 Drawing Figures

METHOD OF MAKING LIGHT-DOT DISTRIBUTION FOR THE HOLOGRAPHIC STORAGE OF BINARY INFORMATION WITH THE AID OF ELECTRONICALLY CONTROLLED SWITCHING MASKS

This is a continuation, of application Ser. No. 411,651, filed 11/1/73, now abandoned.

The invention relates to a method of making light-dot distributions for the holographic storage of binary information with the aid of electronically controlled switching masks.

It is known to make holograms by superposing two coherent light waves, viz. an object wave and a reference wave. The storage of the interference pattern of the two superimposed waves in the form of a density distribution or a phase distribution yields the hologram. When storing binary information the object wave consists of a multiplicity of superimposed individual waves, which originate from a pattern of light dots in the object plane. Each light dot represents an information unit (bit), the information content, for example, being defined by the brightness of the light dot, i.e. a dark light dot represents for example a binary 0 and a bright light dot a binary 1. The simplest method of realizing such a pattern of light dots is by means of a mask which is provided with apertures at certain locations in accordance with the desired information distributions, which mask is included in the radiation path of the object wave.

For recording holograms of different information content, a rapid change of the information distribution in the information mask is required, so as to obtain a rapid holographic storage of information. Such a rapid change becomes possible when the light waves emitted by the individual dots of the information mask are switched as rapidly as possible by electronic control.

Such electronically controlled switching masks (also denoted by the term "page composer") in which the transparency of the switching elements is controlled, are known. These page composers are based on the principle of transparency modulation and have the property that the transmitted luminous flux varies with the information distribution or, more precisely, with the number of transmitted information waves. However, this implies that the illumination of the holograms fluctuates when the information distribution changes. However, in many cases particularly when holographic recording materials with a small dynamic range are used, a constant average illumination of the storage holograms which is independent of the information distribution, is desirable.

It is an object of the invention to make light-dot distributions, for example light-dot rasters, the switching mask always transmitting a constant quantity of light independent of the information distribution. This is achieved by modulation of the individual elements to be switched of the switching mask in their optical paths through blurring of the interference structure in the hologram associated with said elements. A modulation of the optical lengths influences the light phase of the transmitted light wave and thus results in the interference pattern in the hologram associated with said elements becoming blurred.

In addition to the constant luminous flux, a specific advantage of the method is that already after the elements to be modulated have been scanned a single time a refractive index gradient is obtained, after which the recording of the hologram can commence immediately, because the beginning of a variation can be reached more rapidly than the performance of a full switching process until a new stable switching state. For example, when the elements of each line of the matrix are driven in parallel and all lines are driven sequentially, the recording of the hologram may commence after a preparation time of only 100 μsecs. for a "switching mask" with for example 100 lines and 100 elements per column at a scanning rate of 1 MHz. This would yield a rate of access for the hologram recording of $10^8$ bits per second. Futher it is to be noted that, owing to the disturbance of the coherence of the individual components of the object wave with respect to time, the focussing of the light which passes through the switching mask is not at all disturbed; this means that the rays transmitted by the mask are not scattered or geometrically distorted.

The invention will now be explained with reference to the drawing, in which.

Figure 1:
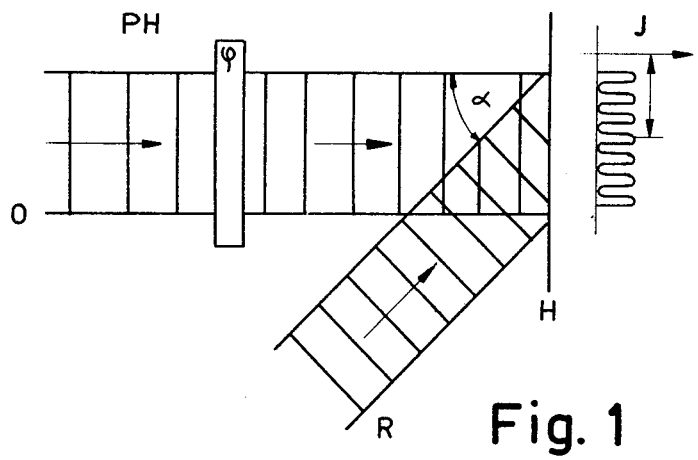
FIG. 1 shows a schematic hologram recording for the purpose of clarification.

For a correct understanding of the principle a basic property of interference patterns in holographic recording is described first. FIG. 1 schematically shows the superposition of an object wave O and a reference wave R. The superimposed coherent waves form an interference pattern J in the plane of the hologram H, which for example in the case of superposition of plane waves of the same amplitude has an intensity distribution proportional to $1 + \cos(2\pi\sin.\alpha/\lambda).x$. Here $\lambda$ represents the wave length of the light, $\alpha$ the angle of incidence of the reference wave and $x$ the local coordinate in the hologram. If a phase shifter PH is inserted in the path of the object wave O, i.e. a device which is capable of modulating the phase of the object wave in a defined manner, the pattern of the interference lines in the hologram plane is shifted in accordance with the phase $\phi$. The position of the interference lines consequently depends on the phase of the object wave and in the hologram plane a light intensity distribution as a function of $\phi$ is obtained which is proportional to:

$$1 + \cos\left[\left\{\frac{2\pi\sin\alpha}{\lambda}\right\}x - \phi\right].$$

When recording the hologram the luminous flux which is incident upon the hologram plane is, for example retained as a density distribution for a certain exposure time $\tau$ when using photographic recording material. Consequently, if during the exposure of the hologram the object wave has a constant phase, the interference pattern will be recorded as a density distribution. When the completed, fixed hologram is again exposed to the reference wave this results in a reconstruction of the object wave of the first diffraction order. However, if the phase is changed during the exposure of the hologram $$\left(\left|\frac{d\phi}{dt}\right| > 0\right),$$

the interference lines are blurred. Under certain exposure conditions, for example, a certain exposure time depending on the characteristic of the recording medium, it can be achieved that the object wave merely causes a uniform density of the recording material. The interference pattern should then be shifted by at least one period width during the exposure. Neither is it possible then to reconstruct an image wave of the object wave from the fixed hologram. This allows either the retention of information in the hologram during the exposure in the case of a constant phase $\phi$, or not to record any information in the hologram during recording in the case of a defined variable phase $\phi(t)$. In storing digital information by means of holograms a binary 1 may then be assigned to, for example the first recording condition and a binary 0 to the second condition. The time modulation of the phase $\phi$ results in deterioration of the coherence.

Figure 2:
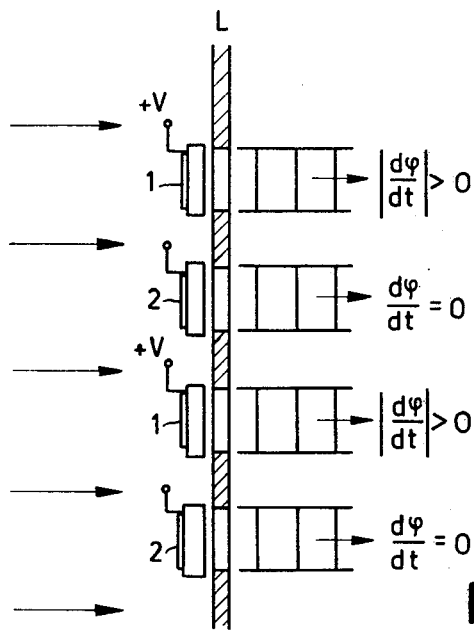
FIG. 2 shows an array of phase shifting elements.
Figure 3:
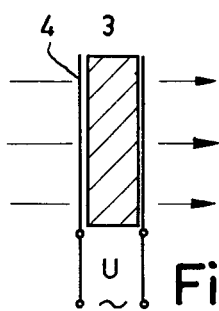
FIG. 3 shows a phase modulation element of a material with an electro-optic effect.
Figure 4:
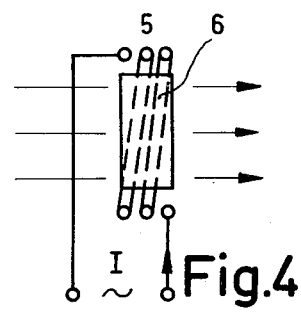
FIG. 4 shows a phase modulation element of a material with a magneto-optic effect.

To construct a switching mask for a hologram store a greater number of phase-shifting elements that can be modulated are arranged in a row or in the form of a matrix in front of a perforated plate L. The light waves of the elements 1, which are then modulated while the hologram is recorded (see FIG. 2), only causes a uniform density in the hologram, i.e., during the reconstruction from the finished hologram only those image waves are reconstructed from the elements 2 of which the associated object waves are applied with a constant phase during the recording. however, in spite of this the total luminous flux applied to the hologram during the exposure remains constant, independent of the number of modulated phase shifting elements, i.e. the operating point in the hologram for arbitrarily recorded information patterns with the same exposure time can be maintained constant. For the practical embodiment it is in principle possible to use all known methods of light phase modulation, i.e. with the aid of electro-optic or acousto-optic modulators. For example, as is shown in FIG. 3, the switching mask may consist of an array of electro-optic modulators 3 of known materials that exhibit an electro-optic effect (e.g. KDP, ADP, nitrobenzene etc.) These modulators, whose refractive index can be modulated through the electro-optic effect, are driven individually by an electrical variable voltage U at transparent electrodes 4, when the phase of the transmitted light is to be modulated. However, it is alternatively possible to employ the piezo-electric effect for the light-phase modulation by an electrically controlled thickness variation of a transparent piezoelectric material. In principle, the known light modulators 6 (e.g. YIG modulators), which are controlled by a coil 5 through which the current I flows, may also be combined in accordance with FIG. 4 to form a phase-modulation switching mask. When the hologram is to be erased again, it is recommended to employ for example lithiumniobate as a hologram material, because this allows the structure to be erased by heat.

Figure 5:
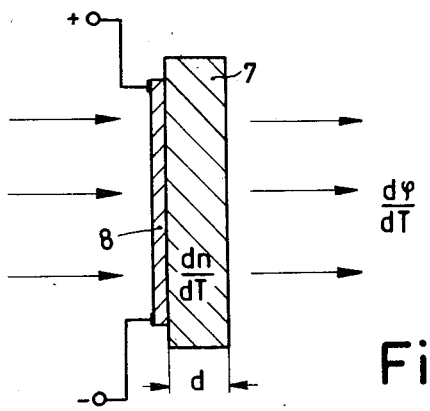
FIG. 5 shows a modulation element of a material with a temperature-dependent refractive index.

FIG. 5 schematically shows an embodiment of a very simple phase shifting element. In a transparent layer 7 of the active material a refractive index gradient dn/dt is obtained by means of a defined temperature variation. This gradient can be obtained in a simple manner, for example with the aid of a transparent electrode 8 disposed on the material surface through which an electric current flows. The electrode 8 is then heated and heats the adjoining transparent active layer 7. After the current is switched off, the layer cools down again. By means of a pulse-shaped electrical drive for example a continuously increasing and decreasing temperature can be attained, so that constantly a temperature gradient as a function of time and thus a refractive index gradient as a function of time are obtained. The variation of the light phase of a wave which passes through the element is then proportional to $$\phi = \frac{2\pi}{\lambda} d \cdot n(t).$$

Here $\lambda$ represents the wavelength of light, $d$ the thickness and $n(t)$ the refractory index as a function of time. The heat produced must then be drained via a thermally stabilized substrate plate, with which the element is thermally coupled.

In a switching mask, in which a multiplicity of such elements are arranged in the form of a matrix, all elements can be driven consecutively by short pulses via a cross-bar system. The scanning rate of the elements must then be selected so that at the same time a refractive index gradient is maintained in the elements to be modulated throughout the duration of the hologram recording.

Figure 6:
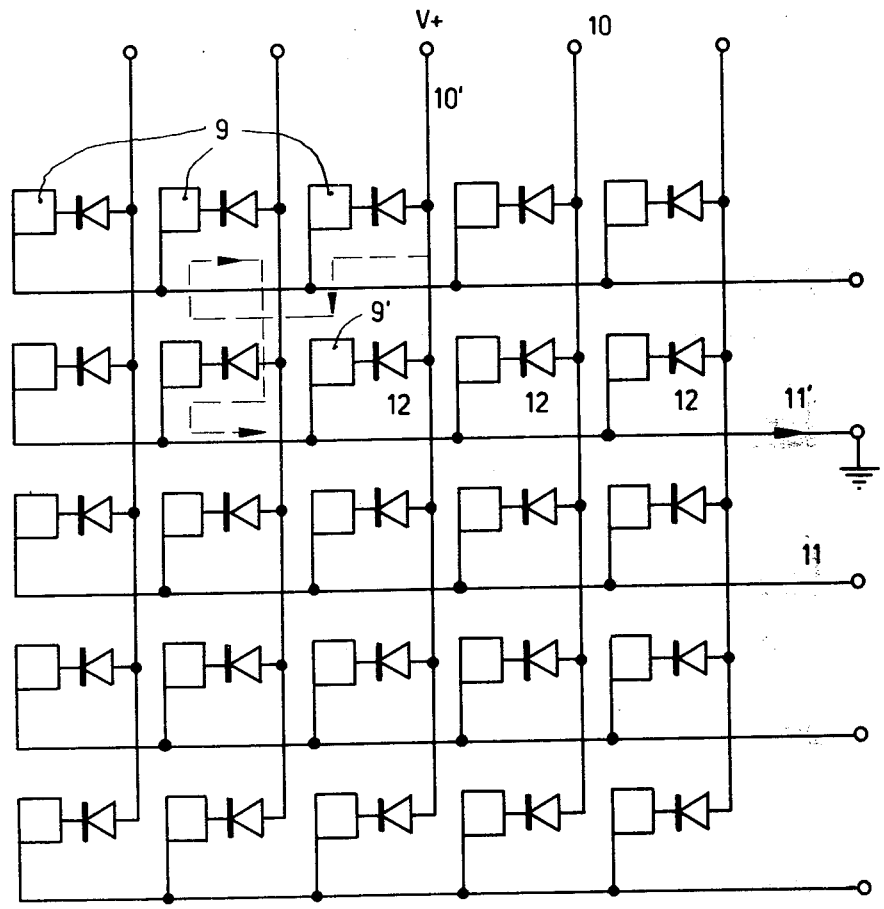
FIG. 6 shows a matrix array with crosswise arranged conductors.

FIG. 6 schematically shows said array of elements 9, which are driven via a cross-bar system 10, 11. In order that only the element 9' at the crossing responds to the application of a voltage to two crossing conductor tracks 10', 11', a blocking diode 12 must be provided for each element, as otherwise additional unwanted currents will flow through the elements which are not driven. Such an array of transparent heating elements driven via a crossbar system has already been proposed in connection with the light modulation by a thermal shift of the band edges in thin monocrystalline layers.

For the practical embodiment of the modulation elements it is effective to select a modulation material having an as high as possible thermal gradient. For example organic liquids, synthetic material, or highly temperature-sensitive crystal layers are particularly suitable for this purpose. These materials may then be interposed as thin layers between two cooled substrate plates of glass, quartz or sapphire, one of the substrate plates accommodating the array of heating elements with the supply leads. If the planar dimensions of the switching elements are then substantially greater than the thickness of the modulation layer, the dissipation of heat in the transverse direction between switched and non-switched elements is negligible, so that no separate thermal isolation of the individual switching elements is necessary.

What is claimed is:

1. Apparatus for making light dot distributions for the holographic storage of binary information comprising a holographic recording medium, a transparent mask having a temperature dependent refractive index, a plurality of heat emitting electronically controlled electrodes on said mask for selectively heating portions of said mask, whereby radiation passing through the mask is phase modulated by those portions of the mask thermally activated by the electrodes. the holographic storage medium being arranged in the path of the radiation passing through the mask, and means for selectively providing electronic signals to said electrodes.

2. Apparatus for making light dot distributions as recited in claim 1, wherein the transparent mask is made of KDP.

3. Apparatus for making light dot distributions as recited in claim 1 wherein said electrodes are arranged in the form of a matrix comprising a grid system of cross conductors, further comprising a rectifier diode connected in series with each electrode.

* * * * *

UNITED STATES PATENT AND TRADEMARK OFFICE
CERTIFICATE OF CORRECTION

PATENT NO. : 3,946,370
DATED : March 23, 1976
INVENTOR(S) : KLAUS PETER SCHMIDT and BERNHARD HILL It is certified that error appears in the above-identified patent and that said Letters Patent are hereby corrected as shown below:

Co. 3, line 8, after "example," should be --для--;

line 36, "however" should be --However--;

Line 67, "dn/dt" should be --dn/dT--;

Signed and Sealed this fifteenth Day of June 1976

[SEAL]

Attest:

RUTH C. MASON
*Attesting Officer*

C. MARSHALL DANN
*Commissioner of Patents and Trademarks*